United States Patent
Chang et al.

(10) Patent No.: US 9,760,478 B2
(45) Date of Patent: Sep. 12, 2017

(54) READ LEVELING METHOD AND MEMORY DEVICE USING THE SAME

(71) Applicant: MACRONIX INTERNATIONAL CO., LTD., Hsinchu (TW)

(72) Inventors: Yu-Ming Chang, Pingtung County (TW); Tai-Chun Kuo, Taipei (TW); Wei-Chieh Huang, Hsin-chu (TW); Ping-Hsien Lin, Taipei (TW); Tzu-Hsiang Su, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 92 days.

(21) Appl. No.: 14/824,192

(22) Filed: Aug. 12, 2015

(65) Prior Publication Data
US 2016/0155516 A1 Jun. 2, 2016

Related U.S. Application Data (60) Provisional application No. 62/086,207, filed on Dec. 2, 2014.

(51) Int. Cl.
*G06F 12/02* (2006.01)
*G11C 16/34* (2006.01)

(52) U.S. Cl.
CPC .......... *G06F 12/023* (2013.01); *G11C 16/349* (2013.01); *G06F 2212/1032* (2013.01)

(58) Field of Classification Search
CPC ........... G06F 12/023; G06F 2212/1032; G11C 29/50004; G11C 2029/5004
USPC ................. 711/103, 105, 154, 165
See application file for complete search history.

(56) References Cited

U.S. PATENT DOCUMENTS

| | | | |
|---|---|---|---|
| 6,842,832 B1 | 1/2005 | Franaszek et al. | |
| 7,818,525 B1 * | 10/2010 | Frost | G06F 12/0246 365/185.25 |
| 2014/0025864 A1 | 1/2014 | Zhang et al. | |
| 2014/0281766 A1 * | 9/2014 | Yang | G06F 11/0793 714/721 |

(Continued)

FOREIGN PATENT DOCUMENTS

| | | |
|---|---|---|
| TW | 509842 B | 11/2002 |
| TW | 201405309 A | 2/2014 |

OTHER PUBLICATIONS

TIPO Office Action dated Nov. 22, 2016 in Taiwan application (No. 104137412).

*Primary Examiner* — Gary Portka
(74) *Attorney, Agent, or Firm* — McClure, Qualey & Rodack, LLP (57) ABSTRACT

A read leveling method for a memory device is provided. The memory device includes a first memory block and at least a second memory block. The read leveling method includes the following steps. Determining whether a block read count of the first memory block is larger than or equal to a first threshold. Detecting a page read count of a page of the first memory block when the block read count of the first memory block is larger than or equal to the first threshold. Determine whether the block read count of the first memory block is larger than or equal to a second threshold. Move data of one of the page of the first memory block to a page of the second memory block when the block read count of the first memory block is larger than or equal to the second threshold.

14 Claims, 6 Drawing Sheets

(56) References Cited

U.S. PATENT DOCUMENTS

2016/0124679 A1* 5/2016 Huang .................. G06F 3/0647
711/103

* cited by examiner

READ LEVELING METHOD AND MEMORY DEVICE USING THE SAME

This application claims the benefit of U.S. Provisional application Ser. No. 62/086,207, filed Dec. 2, 2014, the disclosure of which is incorporated by reference herein in its entirety.

BACKGROUND

Technical Field

The disclosure relates in general to a read leveling method and a memory device using the same.

Description of the Related Art

A read operation to a memory device is to read a page of a memory block of the memory device. And if there are intensive read operations performed on the page of the memory block, even though the other page of the same memory block has never been read, the other page may suffer read disturbance caused by intensive read operations. Moreover, the size of memory device has been decreased in recent years. As the size of the memory device is scaled down, the reliability of the memory device is getting worse at the same time and the smaller memory device could only sustain a smaller number of read disturbances. As a result, the data in the memory devices needs to be refreshed by frequently moving valid data and brings about a larger number of erase and write operations which may degrade system performance significantly. Therefore, it is one of desirable goals to provide a method to deal with read disturbance.

SUMMARY

The disclosure is directed to a read leveling method and a memory device using the same.

According to the disclosure, a read leveling method for a memory device is provided. The memory device includes a first memory block and at least a second memory block. The read leveling method includes the following steps. Determining whether a block read count of the first memory block is larger than or equal to a first threshold. Detecting a page read count of a page of the first memory block when the block read count of the first memory block is larger than or equal to the first threshold. Determine whether the block read count of the first memory block is larger than or equal to a second threshold. Move data of one of the page of the first memory block to a page of the second memory block when the block read count of the first memory block is larger than or equal to the second threshold.

According to the disclosure, a memory device using the read leveling method is provided. The memory device includes a first memory block and at least a second memory block. The first memory block has multiple pages for storing data. The second memory block has multiple pages for storing data. The memory device is configured to determine whether a block read count of the first memory block is larger than or equal to a first threshold. And the memory device is configured to detect a page read count of a page of the first memory block when the block read count of the first memory block is larger than or equal to the first threshold. And the memory device is configured to determine whether the block read count of the first memory block is larger than or equal to a second threshold. And the memory device is further configured to move data of one of the page of the first memory block to a page of the second memory block when the block read count of the first memory block is larger than or equal to the second threshold.

According to the disclosure, another read leveling method for a memory device is provided. The memory device includes a first memory block and at least a second memory block. The read leveling method includes the following steps. Determine whether a block read count of the first memory block is larger than or equal to a first threshold. Identify a page having a highest page read count of the first memory block by a fine-grained counter when the block read count of the first memory block is larger than or equal to the first threshold. Move data of the page having the highest page read count of the first memory block to the second memory block.

DETAILED DESCRIPTION

In the present disclosure, a memory device and read leveling method are provided to avoid read disturbance caused by intensive read operations in the same memory block. Several embodiments are provided hereinafter with reference to the accompanying drawings for describing the related configurations and procedures. However, the present disclosure is not limited thereto. The identical and/or similar elements of the embodiments are designated with the same or similar reference numerals.

Figure 1:
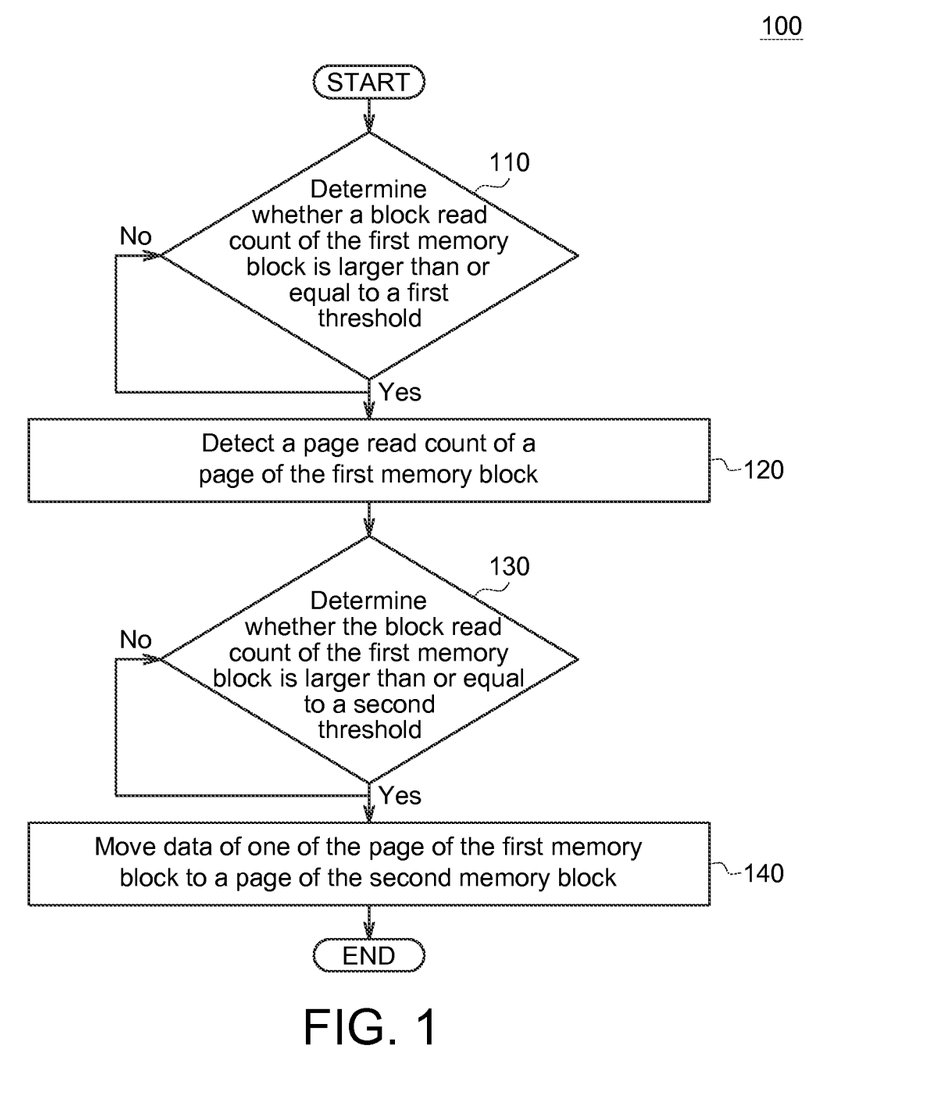
FIG. 1 shows a flow chart of a read leveling method for a memory device according to the first embodiment of the present disclosure.

FIG. 1 shows a flow chart of a read leveling method 100 for a memory device according to the first embodiment of the present disclosure. The memory device includes a first memory block and a second memory block.

Referring to FIG. 1, the read leveling method 100 includes the following steps. Firstly, performing step 110 to determine whether a block read count of the first memory block is larger than or equal to a first threshold. If the block read count of the first memory block is larger than or equal to the first threshold, then performing step 120 to detect a page read count of a page of the first memory block. And then, performing step 130 to determine whether the block read count of the first memory block is larger than or equal to a second threshold. And if the block read count of the first memory block is larger than or equal to the second threshold, then performing step 140 to move data of one of the page of the first memory block to a page of the second memory block. And the read leveling method 100 stops. The detailed description of each step is as follows.

In step 110, the first memory block has a coarse-grained counter for counting the block read count of the first memory block, and the block read count of the first memory block represents the read count of the first memory block. For example, when the block read count of the first memory block is larger than or equal to the Block Read Threshold, e.g. 1000 times, data of a page of the first memory block may suffer the read disturbances caused by other pages of the first memory block and needs to be refreshed. So in step 110, identify the first memory block having the block read count larger than or equal to a first threshold, e.g. 500 times, as a read hot memory block.

In step 120, the first memory block may have at least one fine-grained counter for counting the page read count of at least one page of the first memory block, and the page read count of the at least one of the first memory block represents the read count of the at least one page of the first memory block. And the second threshold is the Block Read Threshold (BRT). And then in step 130, determine whether the first memory block having the block read count larger than or equal to the Block Read Threshold, e.g. 1000 times. If the answer is yes, data of the first memory may suffer the read disturbances and needs to be refreshed.

And finally in step 130, the data of one of the page of the first memory block is moved to a page of the second memory block. For example, the data of the page of the first memory block having the page read count larger than or equal to a third threshold may be identified as read hot data. And the third threshold is Page Read Threshold (PRT), e.g. 500 times. In other embodiments, the data of page of the first memory block having a highest page read count may be identified as read hot data. Therefore, read hot data is extracted from the first memory block and move to the second memory block to avoid the read disturbances caused by read hot data. It is noted that the Block Read Threshold and the Page Read Threshold may set according to applications.

Figure 2:
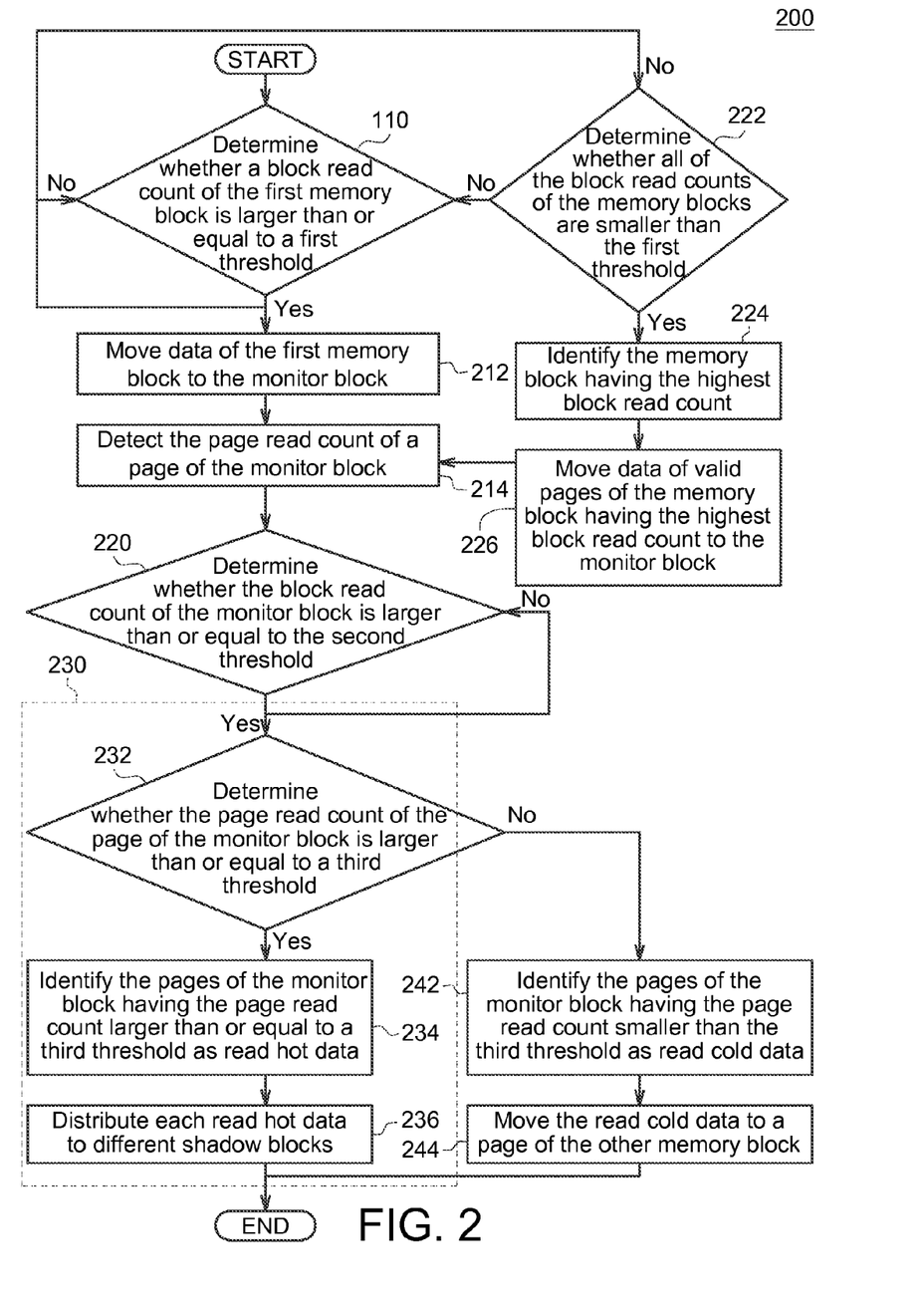
FIG. 2 shows a flow chart of a read leveling method for a memory device according to the second embodiment of the present disclosure.

Referring to FIG. 2, a second embodiment of the read leveling method 200 of the present disclosure is provided. In the second embodiment, the memory device includes more memory blocks, and at least one monitor block and at least one shadow block.

Firstly, performing step 110 to determine whether a block read count of the first memory block is larger than or equal to the first threshold, i.e. Block Read Threshold. If the block read count of the first memory block is or equal to the first threshold BRT, then performing step 212 to move data of the first memory block to the monitor block. The monitor block has at least one fine-grained counter for counting the page read count of each page of the monitor block. Then performing step 214 to detect the page read count of a page of the monitor block. And then performing step 220 to determine whether the block read count of the monitor block is larger than or equal to the second threshold. The second threshold may be the Block Read Threshold or set according to applications. And if the block read count of the monitor block is larger than or equal to the second threshold, then performing step 230 to move data of one of the page of the monitor block to a page of a shadow block. In some embodiments, data of some pages of the monitor block are moved to one or more shadow blocks, and data of the other pages of the monitor block are moved to the other memory blocks. In some other embodiments, the first memory block includes at least a fine-grained counter to detect the page read count of the page of the memory block without the need of moving data of the first memory block to the monitor block.

In some embodiments, the step 230 may include the following steps. For example, if the block read count of the monitor block is larger than or equal to the second threshold, then performing step 232 to determine whether the page read count of the page of the monitor block is larger than or equal to a third threshold. And then performing step 234 to identify the pages of the monitor block having the page read count larger than or equal to a third threshold as read hot data. The third threshold may be a Page Read Threshold (PRT), e.g. 500 times. And the read leveling method may be performed repeatedly in more memory blocks to obtain more read hot data. Finally, performing step 236 to distribute each read hot data to different shadow blocks. Therefore, read hot data are extracted from the memory blocks and move to different shadow blocks. And the fewer read hot data in each shadow block, the more times each read hot data can be read before it needs to be refreshed. In some embodiments, if the block read count of the shadow block is larger than or equal to the Block Read Threshold, then all pages in the shadow block needs to be refreshed or scatter all valid pages in the shadow block to other shadow blocks.

Specifically, suppose a shadow block includes 8 pages and the shadow block contains only one read hot data A stored in the first page of the shadow block, read hot data A could be copied to the next free page on the same block when the block read count of the reaches Block Read Threshold. And this copying process could be repeated 8 times if only one read hot data is kept in this block, and the other 7 pages are free pages. In other words, the shadow block with only one read hot data could sustain the read count of 8 full Block Read Thresholds, i.e. 8000 times, in this example.

On the other hand, suppose a shadow block includes 8 pages and the shadow block contains two read hot data A and B stored in the first page and the second page of the shadow block respectively, and each copying process would copy two read hot data, for each read hot data read hot data A and B to the next two free pages. As a result, the shadow block with two read hot data could only sustain the read count of 4 full Block Read Thresholds, i.e. 4000 times. Thus, even though the total number of read operations issued to the shadow block is the same (for example 8000 times), the first example with only one read hot data will introduce one erase operation, while the second example with two read hot data will introduce two erase operation. And therefore, the shadow block with fewer read hot data could sustain more read counts, while the shadow block with more read hot data sustain less read counts and has less capability to tolerate intensive read operations.

In other embodiments, if the page read count of the page of the monitor block is smaller than the third threshold, then performing step 242 to identify the pages of the monitor block having the page read count smaller than the third threshold as read cold data. And finally, performing step 244 to move the read cold data to a page of the other memory blocks.

In some embodiments, after step 110 is performed, performing step 222 to determine whether all of the block read counts of the memory blocks are smaller than the first threshold. If all of the block read counts of the memory blocks are smaller than the first threshold, that is, none of the memory blocks reaches the Block Read Threshold, then performing step 224 to identify the memory block having the highest block read count. And then performing step 226 to move data of valid pages of the memory block having the highest block read count to the monitor block. And after the data of valid pages of the memory block having the highest block read count is moved to the monitor block, performing step 214 to detect the page read count of a page of the monitor block. And then perform the resting step described above to identify read hot data and move read hot data to the shadow block.

Figure 3:
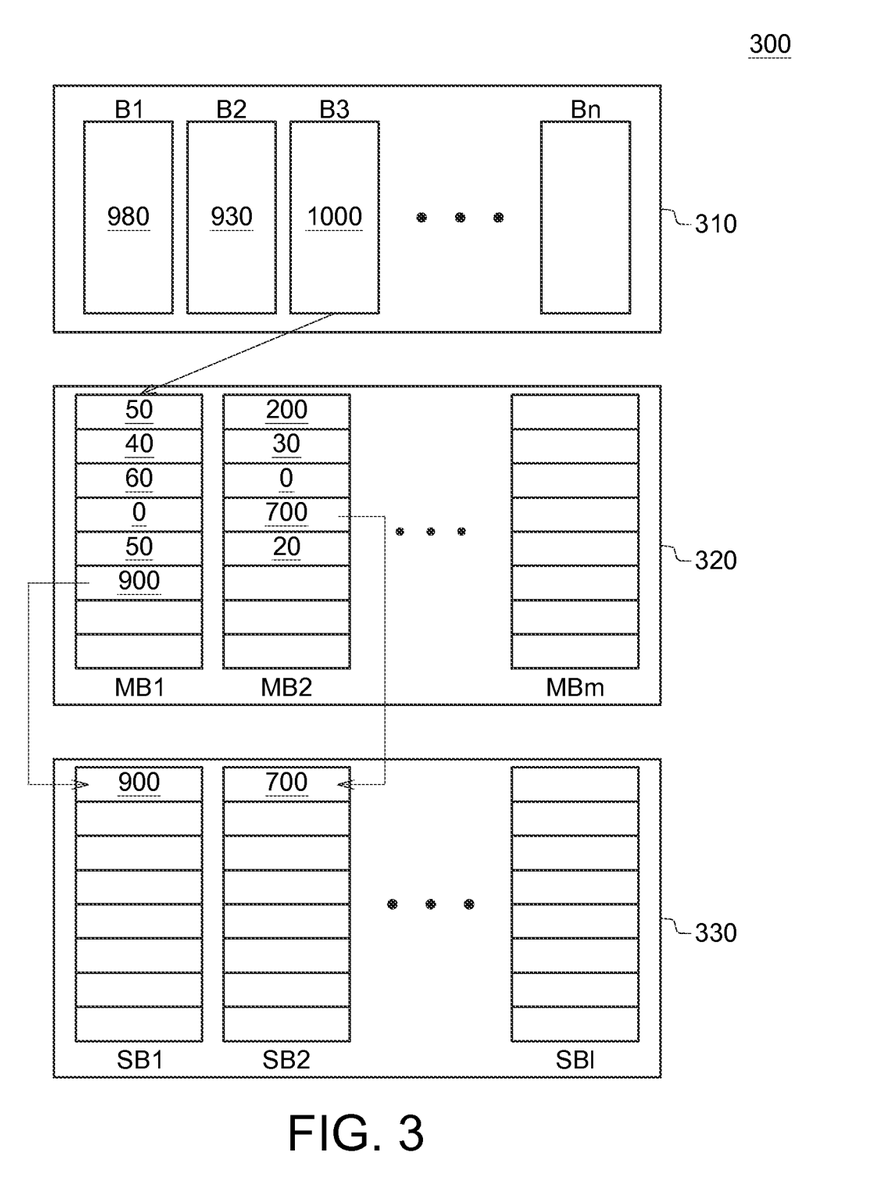
FIG. 3 shows a diagram of a memory device and the read leveling method according to the second embodiment.

FIG. 3 shows a diagram of a memory device 300 and the read leveling method according to the second embodiment. As illustrated in FIG. 3, the memory device 300 includes memory blocks 310, monitor blocks 320 and shadow blocks 330. Each of the memory blocks B1, B2 . . . , Bn has a coarse-grained counter for counting the block read count of each memory block. As shown in FIG. 3, the block read count of memory block B1 is 980, the block read count of memory block B2 is 930, the block read count of memory block B3 is 1000, and so on. The data of the memory block having a block read count larger than or equal to the Block Read Threshold is moved to the monitor block. For example, suppose we set the Block Read Threshold is 1000, and the block read count of memory block B3 is equal to the Block Read Threshold. And then data of memory block B3 is moved to a monitor block MB1.

Each of the monitor blocks MB1, MB2 . . . , MBm has fine-grained counters for counting the page read count of each page of the monitor block. As shown in FIG. 3, each of the monitor blocks MB1, MB2 . . . , MBm includes 8 pages, and the page read count of a first page of the monitor block MB1 is 50, the page read count of a second page of the monitor block MB1 is 40, the page read count of a third page of the monitor block MB1 is 60, and so on. The data of the page of the monitor block having a page read count larger than or equal to the Page Read Threshold is identified as read hot data and needs to be moved to the shadow block. For example, suppose we set the Page Read Threshold is 500, and the page read count of the sixth page of the monitor block MB1 is 900, which is larger than the Page Read Threshold. And therefore data of the sixth page of the monitor block MB1 is moved to shadow block SB1 when the block read count of the monitor block MB1 is larger than the second threshold. On the other hand, the data of other page of the monitor block having a page read count smaller than the Page Read Threshold is identified as read cold data and then the read cold data is moved to another memory block. By separating the read hot data and the read cold data, the read leveling method is completed.

The above process can be performed repeatedly to find all read hot data. As shown in FIG. 3, the page read count of the fourth page of the monitor block MB2 is 700, which is also larger than the Page Read Threshold and thus it is also be identified as read hot data. And then data of the fourth page of the monitor block MB2 is moved to shadow block SB2. In this embodiment, each read hot data is distributed to different shadow blocks SB1, SB2, . . . SBI so that each shadow block does not containing too many read hot data and therefore each read hot data can be read more times before refreshing.

Figure 4:
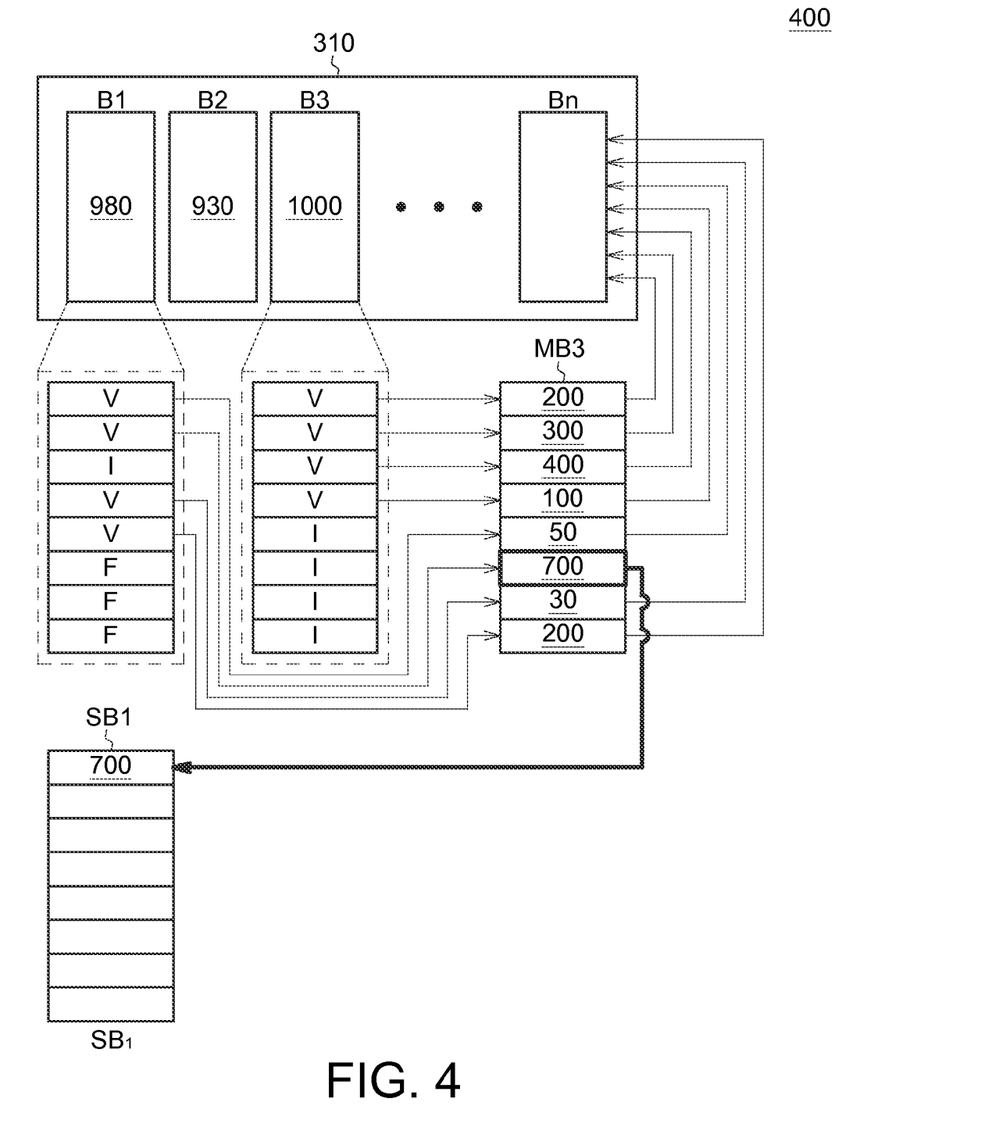
FIG. 4 shows a diagram of a memory device and the read leveling method according to a third embodiment.

FIG. 4 shows a diagram of a memory device 400 and the read leveling method according to a third embodiment. In this embodiment, memory block B3 has a block read count equal to the BRT. And as shown in FIG. 4, memory block B3 has four valid pages (denoted as V) and four invalid pages (denoted as I). Instead of moving data of the whole block, only data of valid pages of memory block B3 is moved to monitor block MB3. Next, find another memory block having a block read count larger than or equal to the first threshold and then move data of valid pages of the another memory block to the rest page of monitor block MB3.

In this embodiment, only memory block B3 has a block read count larger than or equal to the BRT. Alternatively, identifying the rest memory block having the highest block read count other than memory block B3 when all of the block read counts of the memory blocks other than memory block B3 are smaller than the first threshold. For example, memory block B1 has the largest read count 980 other than memory block B3. As shown in FIG. 4, memory block B1 has four valid pages (denoted as V), one invalid page (denoted as I) and three free pages (denoted as F). And data of valid pages of memory block B1 is moved to the rest page of monitor block MB3. Afterwards, determining whether the page read count of monitor block MB3 is larger than or equal to the Page Read Threshold to identify read hot data. In some embodiments, identify the page having the highest page read count of monitor block MB3 as read hot data. And move read hot data to shadow blocks. As shown in FIG. 4, the sixth page of monitor block MB3 having the page read count 700, which is larger than the Page Read Threshold (e.g. 500), and therefore it is identified as read hot data and is moved to shadow block SB1, while the other page of monitor block MB3 is smaller than the Page Read Threshold. Thus, the other page of monitor block MB3 is identified as read cold data and is moved to other memory blocks accordingly.

Figure 5:
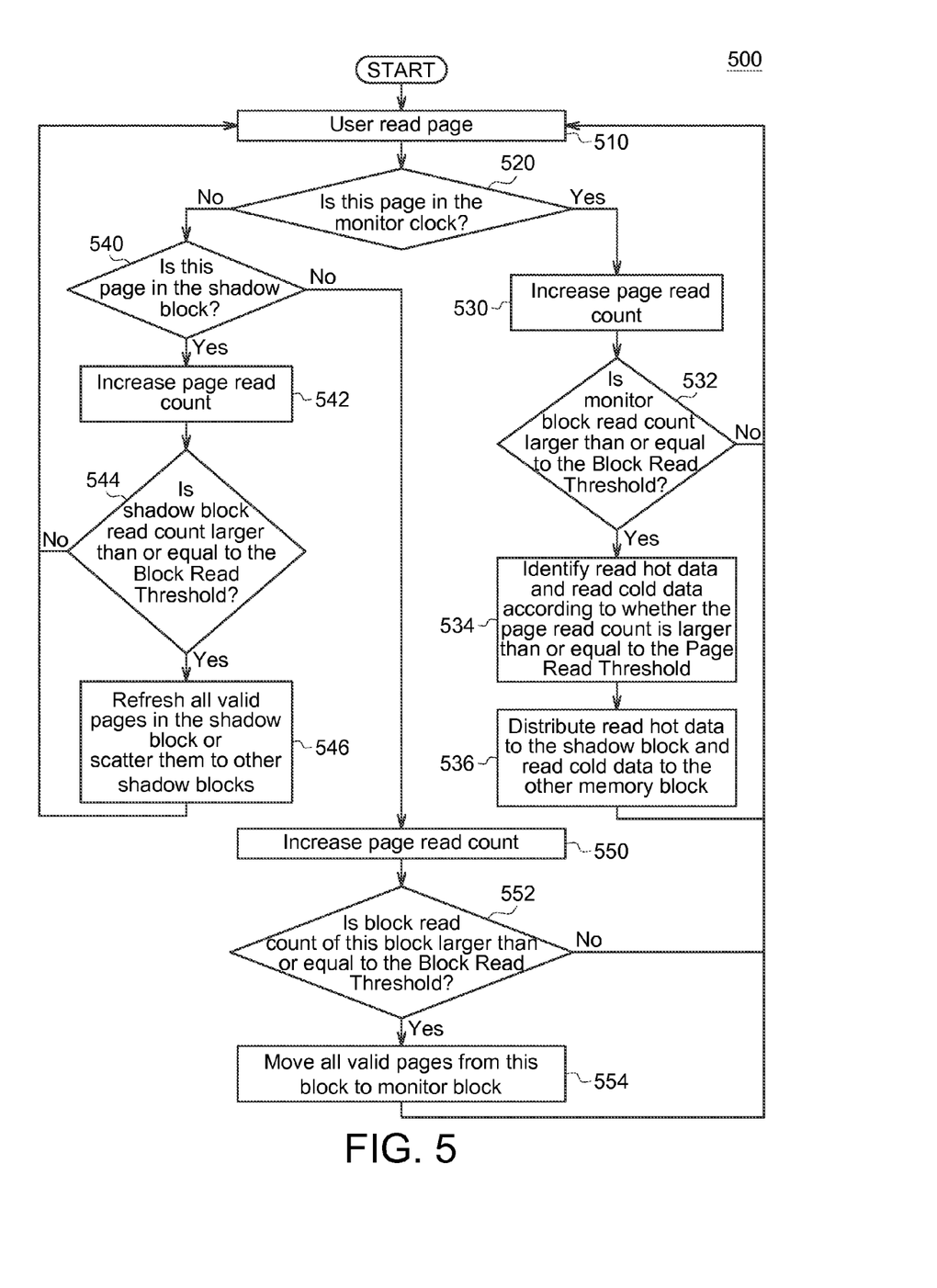
FIG. 5 shows a flow chart of a read leveling method for a memory device according to a fourth embodiment of the present disclosure.

FIG. 5 shows a flow chart of a read leveling method 500 for a memory device according to a fourth embodiment of the present disclosure. The read leveling method 500 may be applied to the memory device shown in FIG. 3 or the memory device shown in FIG. 4. The read leveling method starts, and in step 510, a user read page. Then, in step 520, determine whether this page is in the monitor clock. If this page is in the monitor clock, then the page read count of this page is increased in step 530. And then in step 532, determine whether the monitor block read count is larger than or equal to the Block Read Threshold. If the answer is yes, then performing step 534 to identify read hot data and read cold data according to whether the page read count is larger than or equal to the Page Read Threshold. And then performing step 536 to distribute read hot data to the shadow block and read cold data to the other memory block.

And if this page is not in the monitor block, then performing step 540 to determine whether this page is in the shadow block. And if the answer is yes, then the page read count of this page is increased in step 542. And then in step 544, determine whether the shadow block read count is larger than or equal to the Block Read Threshold. If the answer is yes, then performing step 546 to refresh all valid pages in the shadow block or scatter them to other shadow blocks.

On the other hand, if this page is also not in the shadow block, that is, it is in normal memory block. Then in step 550, since the normal memory block does not have a fine-grained counter for counting page read count of each page of the normal memory block, increase the block read count of the normal memory block. And then performing step 552 to determine whether the block read count of the normal memory block is larger than or equal to the Block Read Threshold. If the answer is yes, performing step 554 to move all valid pages from this block to monitor block. The above process can be performed repeatedly every time a page is read by the user.

Figure 6:
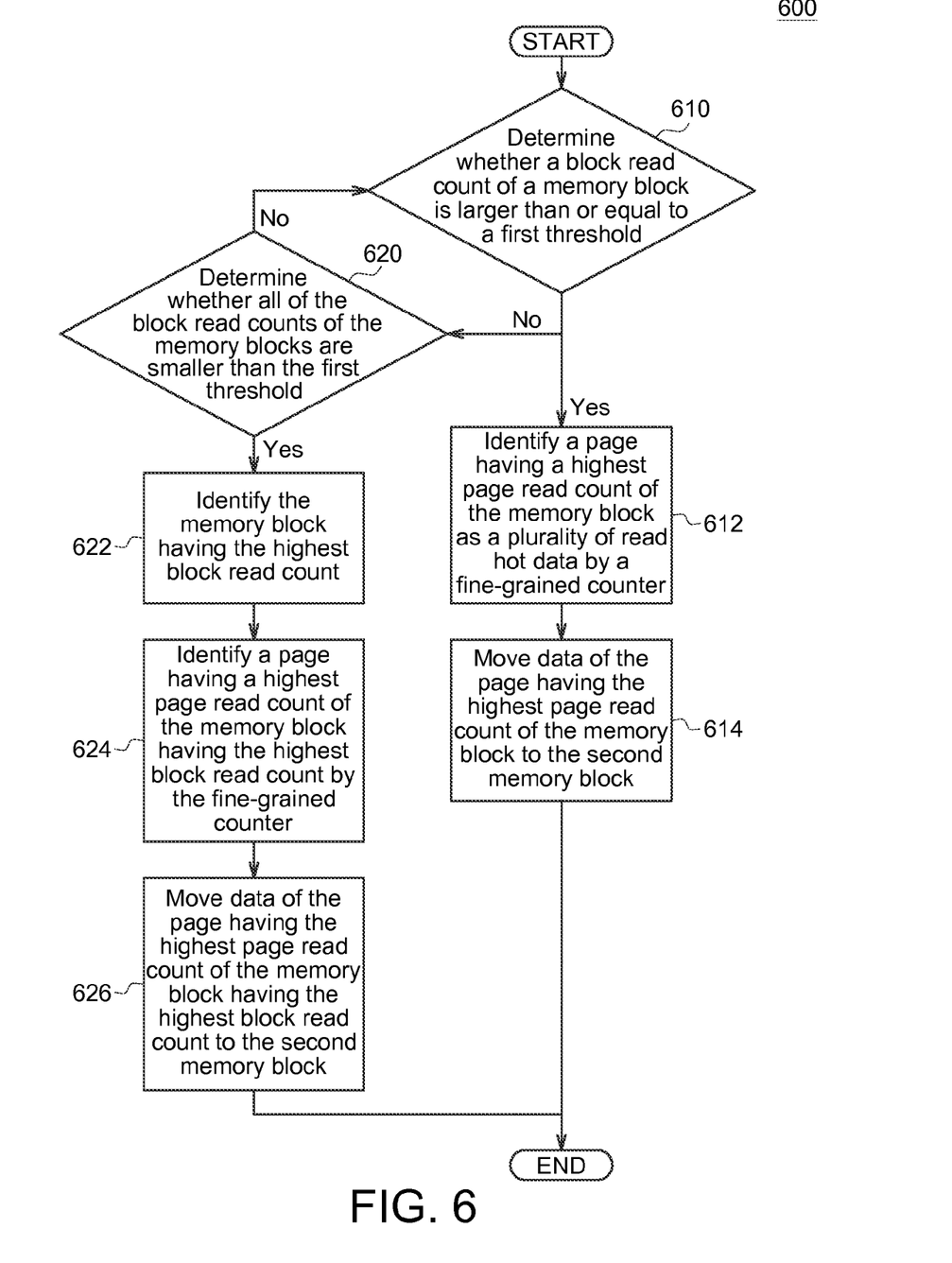
FIG. 6 shows a flow chart of a read leveling method for a memory device according to a fifth embodiment of the present disclosure.

FIG. 6 shows a flow chart of a read leveling method 600 for a memory device according to the fifth embodiment of the present disclosure. The read leveling method 600 may be applied to the memory device shown in FIG. 3 or the memory device shown in FIG. 4. Please refer to FIG. 6, the read leveling method 600 starts, and in step 610, determine whether a block read count of a memory block is larger than or equal to a first threshold. If the answer is yes, then performing step 612 to identify a page having a highest page read count of the memory block as a plurality of read hot data by a fine-grained counter. And then performing step 614 to move data of the page having the highest page read count of the memory block to the second memory block.

In some embodiments, after step 610 is performed, performing step 620 to determine whether all of the block read counts of the memory blocks are smaller than the first threshold. If the answer is yes, then performing step 622 to identify the memory block having the highest block read count. And then performing step 624 to identify a page having a highest page read count of the memory block having the highest block read count by the fine-grained counter. And then performing step 626 to move data of the page having the highest page read count of the memory block having the highest block read count to the second memory block. And the above process can also be performed repeatedly until all read hot data are moved to the second memory block.

According to the above embodiments, several read leveling methods are provided to identify read hot data and then move read hot data to the other memory blocks so that the block with fewer and only read hot data can sustain more read operations to minimize the read disturbance to other pages of the same block. And also, the times of the erase operations can be reduced by using the read leveling methods described above so that the refreshing times can also be reduced. In some embodiments, read hot data are distributed to different blocks as evenly as possible, and therefore interference between read hot data and other valid data on the same block may be minimized.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A read leveling method for a memory device comprising a first memory block and at least a second memory block, and the method comprises:
    determining whether a block read count of the first memory block is larger than or equal to a first threshold;
    detecting a plurality of page read counts of a plurality of pages of the first memory block by a fine-grained counter and determining which one of the pages has a highest page read count when the block read count of the first memory block is larger than or equal to the first threshold;
    determining whether the block read count of the first memory block is larger than or equal to a second threshold; and
    moving data of a page of the first memory block having a highest page read count to a page of the second memory block when the block read count of the first memory block is larger than or equal to the second threshold.

2. The read leveling method according to claim 1, the memory device further comprises at least one monitor block, and the method comprises:
    moving data of the first memory block to the monitor block when the block read count of the first memory block is larger than or equal to the first threshold;
    detecting plurality of page read counts of a plurality of pages of the monitor block;
    determining whether the block read count of the monitor block is larger than or equal to the second threshold; and
    moving data of a page of the monitor block having a highest page read count to the page of the second memory block when the block read count of the monitor block is larger than or equal to the second threshold.

3. The read leveling method according to claim 2, wherein a step of moving data of the first memory block to the monitor block when the block read count of the first memory block is larger than or equal to the first threshold comprises:
    moving data of valid pages of the first memory block to the monitor block when the block read count of the first memory block is larger than or equal to the first threshold.

4. The read leveling method according to claim 3, the memory device further comprises a third memory block, and the method comprises:
    determining whether the block read count of the third memory block is larger than or equal to the first threshold; and
    moving data of valid pages of the third memory block to the monitor block when the block read count of the third memory block is larger than or equal to the first threshold.

5. The read leveling method according to claim 3, the memory device further comprises a plurality of memory blocks, and the method comprises:
    determining whether all of the block read counts of the memory blocks are smaller than the first threshold;
    identifying a memory block having a highest block read count when all of the block read counts of the memory blocks are smaller than the first threshold; and
    moving data of valid pages of the memory block having the highest block read count to the monitor block.

6. The read leveling method according to claim 1, the memory device-further comprises a plurality of memory blocks, and the method comprises:
    determining whether a page read count of the at least one of the pages of the first memory block is larger than or equal to a third threshold when the block read count of the first memory block is larger than or equal to the second threshold;
    identifying the at least one page of the first memory block having the page read count larger than or equal to the third threshold as a plurality of read hot data; and
    distributing each read hot data to different second memory blocks.

7. The read leveling method according to claim 1, further comprising:
    detecting the block read count of the first memory block counted by a coarse-grained counter;
    and
    moving data of at least one of the pages of the first memory block having a page read count larger than or equal to a third threshold to a page of the second memory block.

8. A memory device, comprising:
    a first memory block having a plurality of pages for storing data; and
    at least a second memory block having a plurality of pages for storing data;
    wherein the memory device is configured to:
    determine whether a block read count of the first memory block is larger than or equal to a first threshold;
    detect a plurality of page read counts of a plurality of pages of the first memory block by a fine-grained counter and determining which one of the pages has a highest page read count when the block read count of the first memory block is larger than or equal to the first threshold;

determine whether the block read count of the first memory block is larger than or equal to a second threshold; and move data of a page of the first memory block having a highest page read count to a page of the second memory block when the block read count of the first memory block is larger than or equal to the second threshold.

9. The memory device according to claim 8, further comprising:

at least one monitor block;

wherein the memory device is configured to:

move data of the first memory block to the monitor block when the block read count of the first memory block is larger than or equal to the first threshold;

detect plurality of page read counts of a plurality of pages of the monitor block;

determine whether the block read count of the monitor block is larger than or equal to the second threshold; and move data of a page of the monitor block having a highest page read count to the page of the second memory block when the block read count of the monitor block is larger than or equal to the second threshold.

10. The memory device according to claim 9, wherein the memory device is configured to:

move data of valid pages of the first memory block to the monitor block when the block read count of the first memory block is larger than or equal to the first threshold.

11. The memory device according to claim 10, further comprising:

a third memory block;

wherein the memory device is configured to:

determine whether the block read count of the third memory block is larger than or equal to the first threshold; and move data of valid pages of the third memory block to the monitor block when the block read count of the third memory block is larger than or equal to the first threshold.

12. The memory device according to claim 10, further comprising:

a plurality of memory blocks;

wherein the memory device is configured to:

determine whether all of the block read counts of the memory block are smaller than the first threshold;

identify a memory block having a highest block read count when all of the block read counts of the memory blocks are smaller than the first threshold; and move data of valid pages of the memory block having the highest block read count to the monitor block.

13. The memory device according to claim 9, wherein the memory device is configured to:

determine whether a page read count of at least one of the pages of the first memory block is larger than or equal to a third threshold when the block read count of the first memory block is larger than or equal to the second threshold;

identify the at least one page of the first memory block having the page read count larger than or equal to the third threshold as a plurality of read hot data; and distribute each read hot data to different second memory blocks.

14. The memory device according to claim 8, further comprising:

a coarse-grained counter for counting the block read count of the first memory block; and wherein the memory device is configured to:

move data of a page of the first memory block having a page read count larger than or equal to a third threshold to the page of the second memory block.

* * * * *